United States Patent
Hales et al.

(10) Patent No.: US 8,026,838 B2
(45) Date of Patent: Sep. 27, 2011

(54) CURRENT MODE ANALOG-TO-DIGITAL CONVERTER

(75) Inventors: Rex K. Hales, Riverton, UT (US); Marcellus C. Harper, Kaysville, UT (US); Tracy Johancsik, Murray, UT (US); Yusuf Haque, Woodside, CA (US)

(73) Assignee: Siflare, Inc., Sandy, UT (US)

( * ) Notice: Subject to any disclaimer, the term of this patent is extended or adjusted under 35 U.S.C. 154(b) by 0 days.

(21) Appl. No.: 12/870,146

(22) Filed: Aug. 27, 2010

(65) Prior Publication Data

US 2010/0321227 A1    Dec. 23, 2010

Related U.S. Application Data

(63) Continuation-in-part of application No. 11/782,955, filed on Jul. 25, 2007, now Pat. No. 7,804,436.

(60) Provisional application No. 60/820,393, filed on Jul. 26, 2006.

(51) Int. Cl.
*H03M 1/12*    (2006.01)

(52) U.S. Cl. .................... 341/155; 341/161

(58) Field of Classification Search .......... 341/155, 341/156, 161, 120, 158
See application file for complete search history.

(56) References Cited

U.S. PATENT DOCUMENTS

| | | | |
|---|---|---|---|
| 6,906,503 B2 * | 6/2005 | Lopez-Santillana et al. | 323/283 |
| 7,688,238 B2 * | 3/2010 | Lewis et al. | 341/120 |
| 2005/0149205 A1 * | 7/2005 | Strittmatter | 700/10 |
| 2005/0254106 A9 * | 11/2005 | Silverbrook et al. | 358/539 |

* cited by examiner

*Primary Examiner* — Shawki Ismail
*Assistant Examiner* — Joseph J Lauture
(74) *Attorney, Agent, or Firm* — Steven L. Nichols; Van Colt, Bagley, Cornwall & McCarthy P.C.

(57) ABSTRACT

A current-mode analog-to-digital converter includes: a current input node; a current-mode sample and hold circuit configured to output a steady source of electrical current having an analog value proportional to a sampled analog value of an electrical current at the current input node; and at least one current comparator that compares the electrical current output by the current-mode sample and hold circuit to at least one reference current to produce a digital representation of the sampled analog value of the electrical current at the current input node.

35 Claims, 17 Drawing Sheets

CURRENT MODE ANALOG-TO-DIGITAL CONVERTER

CROSS-REFERENCE TO RELATED APPLICATION

The present application is a continuation-in-part of pending U.S. patent application Ser. No. 11/782,955, filed Jul. 25, 2007; entitled "Current Mode Analog-to-Digital Converter," which claims priority from U.S. provisional patent application Ser. No. 60/820,393, filed Jul. 26, 2006. The disclosure of the '955 application is incorporated herein in its entirety by reference.

BACKGROUND

Historically, engineers have been trained to design circuits in terms of voltage. While analyzing circuits, a designer typically concentrates on the voltage at each node. When doing integrated circuit analysis, designers look at the voltage change on the output due to a voltage change on the Input. Circuit simulators also follow this approach by constructing matrices of nodes to solve for node voltages. On the test bench, voltage sources are used to operate circuits under test, and test equipment measures voltage.

Over the years, integrated circuits have seen incredible increases in density. With each reduction in feature size, there has also been a reduction in optimal operating voltage. These decreases in operating voltage have required reductions in threshold voltages in an attempt to maintain noise margins. Analog circuits, particularly analog-to-digital converters (ADCs) have suffered from this reduction, and are typically designed with higher voltage transistors and operating voltages than are available to digital designers.

In a typical voltage mode ADC, the voltage being sampled is stored on a capacitor. It can be shown that the minimum size of the capacitor storing the voltage must be $>kT/(Vn^2)$, where k is Boltzman's constant, T is temperature in Kelvin, and Vn is the size of the largest noise signal, usually less than ¼ of the ADC's least significant bit (LSB), that can be tolerated to give a low probability of error. As the operating voltage is reduced due to newer processes, the minimum capacitor size increases. This increases both the size of the circuit and the power used.

The accuracy of a voltage mode circuit, including a voltage mode ADC, is determined by the size of the capacitance used to store the voltage. The speed of a voltage mode circuit is consequently affected by circuit capacitance and parasitic capacitance. The nodes of a voltage mode circuit must change voltage during operation of the circuit over a range that is often approximately the entire voltage range of the power supply voltage. Changing the voltage requires that the circuit and parasitic capacitances must charge and discharge. Smaller integrated circuit geometries have been able to reduce circuit capacitance, at the cost of smaller supply voltages, which has a negative impact on noise margins.

BRIEF DESCRIPTION OF THE DRAWINGS

The accompanying drawings illustrate various embodiments of the principles described herein and are a part of the specification. The illustrated embodiments are merely examples and do not limit the scope of the disclosure.

Throughout the drawings, identical reference numbers designate similar, but not necessarily identical, elements.

DETAILED DESCRIPTION

Figure 1:
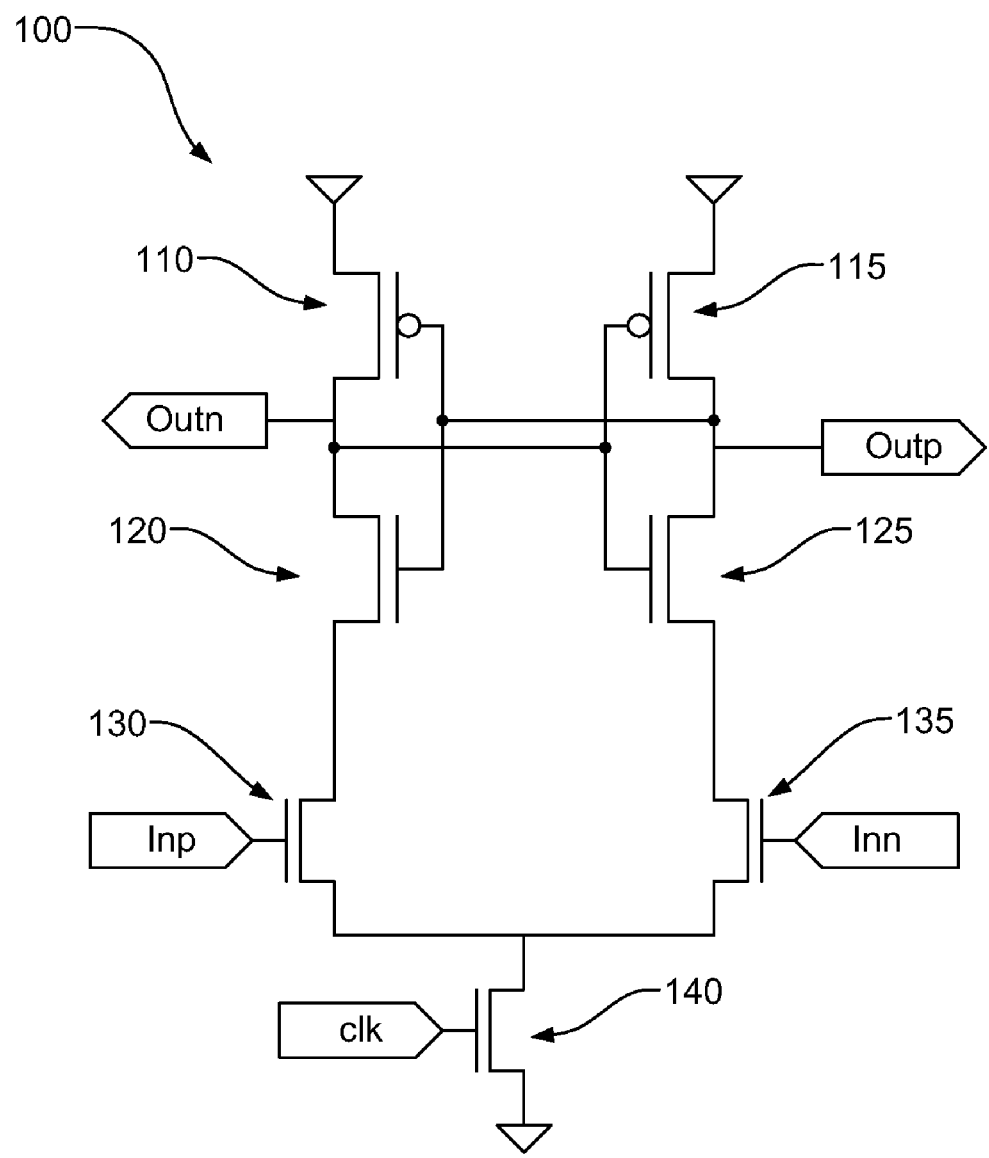
FIG. 1 shows a simplified schematic of an illustrative sense amplifier comparator according to one exemplary embodiment of principles described herein.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

As mentioned above, past and present electronics industries have overwhelmingly designed and maintained products in terms of voltage. Hence, voltage mode has long been established as the accepted implementation of devices performing conversion of analog signals to digital output signals. However, in many design applications involving these analog-to-digital converters (ADCs), a current output by an electrical component or system must first be converted to a voltage before it can be measured by an ADC. This conversion of currents to voltages typically expends a relatively large amount of power in relation to the power consumption of the ADC itself. Moreover, additional electronic components are generally required to perform the conversion, thus complicating circuit designs and increasing costs, and often taking up valuable board space.

The present specification describes, among other things, exemplary implementations for current mode ADCs. As will be described in more detail below, the use of a current mode ADC having current input is advantageous in many systems and often results in reduced power consumption, fewer components, lower cost, faster operating speeds, simplified layout, and higher accuracy.

In some examples, as will be described in more detail below, a current input current mode ADC operates, for example, by comparing an input current to one or more reference currents to create a digital representation of the incoming signal. The ADC described herein may be used in a variety of applications including but not limited to, battery level measurement (metering), communications, imaging, measurement, control systems, sensors, etc.

As described above, traditional circuit design is done in terms of voltage. Circuits are designed in terms of voltage merely for the convenience for the typical designer. For example, in the field of analog-to-digital conversion, voltage mode ADC's compare an input voltage to reference voltages to determine which reference voltage is closest to the value of the Input. A digital representation of the input signal is then created based on a series of such voltage comparisons.

However, there are several advantages to designing circuits in terms of current. As will be described in more detail below, an input current may be compared to a set of current references to determine which reference current is closest to the input current. A digital representation of the input signal may then be created based on a series of such current comparisons.

One of the many values of this approach is that, since current sources are used rather than voltage references, operational voltage becomes far less important. By allowing lower operating voltages to be used, the ADC can take better advantage of the increases in modern integrated circuit density. Also, since the voltages at nodes in a current mode circuit change very little, circuit and parasitic capacitances have much less effect on the speed of the circuit.

An exemplary design of a current mode ADC suitable for use with the principles of the present specification will now be described in more detail for illustratory and enablement purposes. However, those skilled in the art will recognize that any of many embodiments of current mode ADCs may be used in conjunction with the principles of the present specification.

As described herein, a current based ADC design uses a comparator that is configured to compare two currents and output a digital value dependent on which current is larger. The sense amplifier, which has been used in Random Access Memory (RAM) technology, can provide such a comparator. Sense amplifiers are traditionally used to differentially compare true and complement outputs of a RAM bit to determine its value on read.

Since the sense amplifier compares current values differentially, problems with parasitic capacitances on the bit lines are avoided. Current differences can be detected accurately at very high speeds without the need to wait for the voltages to slew to final values, the timing of which is very sensitive to parasitic capacitance.

In a specific example described herein, a current mode flash ADC is composed of $2^N$ sense amplifier comparators and current references, where N is the number of bits output for each comparison. This flash ADC can also be used as a building block in other types of ADCs such as a sub-ranging ADC, pipelined ADC, Sigma-Delta Modulator, Successive Approximation ADC and others.

The exemplary current mode flash ADC may be embodied as a 4-bit ADC with the ability for conversion of analog-to-digital signals at a rate of 1 Giga-Sample per Second (GSPS). This ADC is composed of 16 differential current comparators. The reference Inputs are composed of 16 current sources generated by mirroring current from a single current source. Since it is a flash ADC, the value of the Input does not have to be stored, therefore there are no capacitors required by the design. The current comparators and current mirrors can be easily scaled according to process geometries. Since the ADC is based on current, it has little dependence on the value of the power supply voltage.

Referring to FIG. 1, a simplified schematic of an exemplary sense amplifier comparator (100). The comparator is able to detect very small voltage changes on input nodes (Inp and Inn). Typically in a RAM application, the input nodes (Inp and Inn) are charged to a supply voltage while a clock node (clk) is held low. When clk goes high, Inp or Inn starts to change voltage as the RAM cell discharges the capacitance of the Inp or Inn signal. At the same time the NMOS transistor (140) turns on and causes a current to start flowing in transistors (130) and (135). This current is proportional to the voltage at the gates of transistors (130) and (135). NMOS transistor (120) and NMOS transistors (110) together form an inverter with the output labeled Outn and the input as Outp. NMOS transistor (125) and NMOS transistor (115) form an inverter with the output labeled Outp and input as Outn. These transistors provide positive feedback that gives the circuit much higher gain than just the gain of the differential pair formed by transistors (130) and (135).

Figure 2:
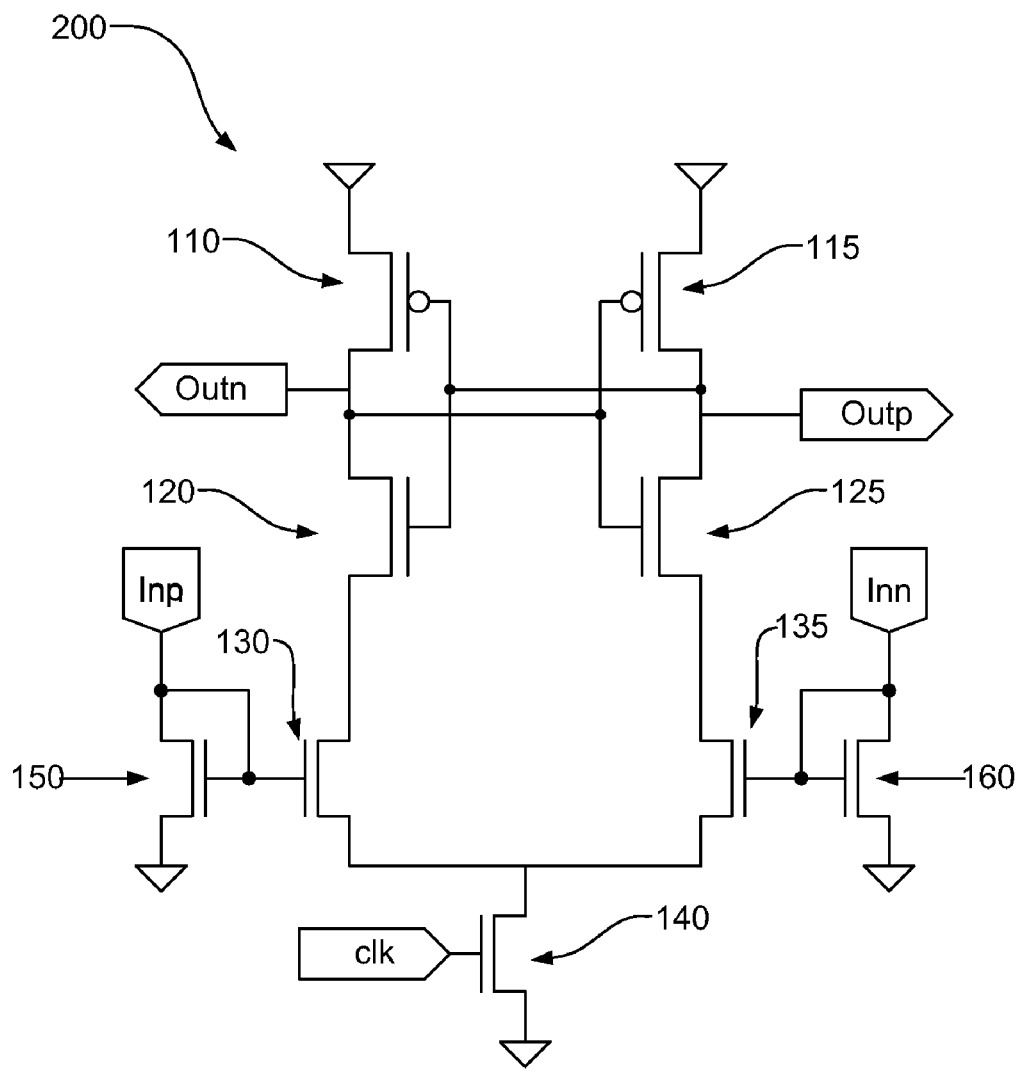
FIG. 2 shows an illustrative modification of the sense amplifier comparator of FIG. 1 including a current mirror according to one exemplary embodiment of principles described herein.

FIG. 2 shows a modification of the sense amplifier of FIG. 1 which gives a simple current mirror Input to the sense amplifier comparator. NMOS transistors (150) and (160) have been added to the sense amplifier comparator shown previously in FIG. 1 to form a current mirror configuration with transistor (130) and transistor (135), respectively. When clk is high, the current in transistor (130) will be the same as transistor (150) due to both transistors having the same gate voltage and nearly the same source voltage, as the source voltage of transistor (130) is pulled nearly to ground by NMOS transistor (140). By the same token, the current in transistor (135) will be the same as transistor (160). Hence, the configuration shown in FIG. 2 may be used directly as a current comparator.

As explained above, the comparator of FIG. 2 can be used to give a digital output at Outp of "1" or "high" if the current into the Inp input is greater than the current into the Inn input. As will be described below, this current comparator may be used in a current mode ADC.

Figure 3:
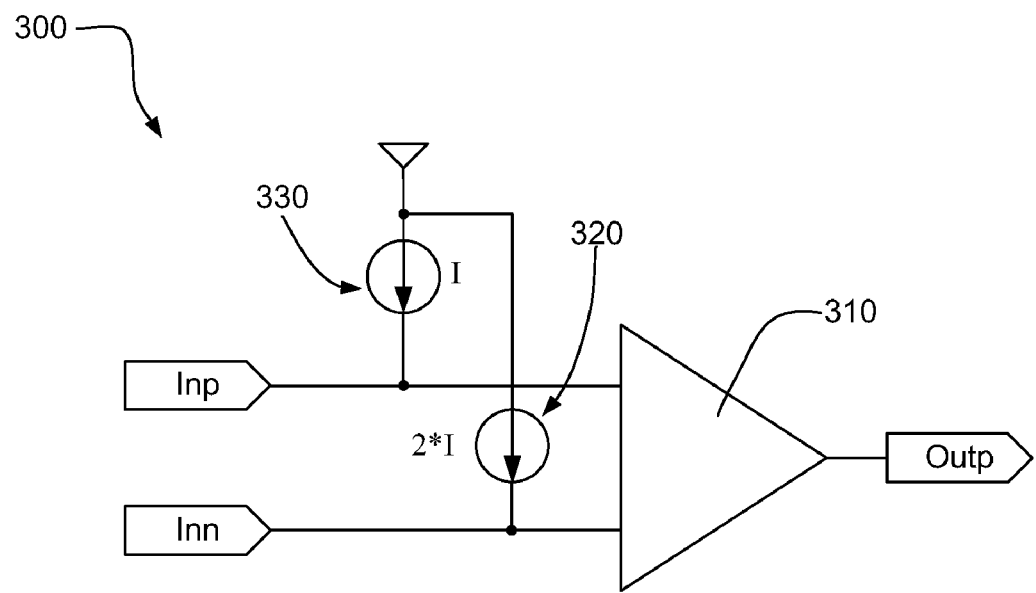
FIG. 3 shows the illustrative modified sense amplifier comparator of FIG. 2 as a block with illustrative current sources used to adjust current levels according to one exemplary embodiment of principles described herein.

FIG. 3 shows the comparator of FIG. 2 as a current comparator block (310). Current sources (320) and (330) add electrical current to the currents in the Inp and Inn Inputs. These additional currents, as shown in the present example, are set to provide thresholds for the comparator so that the current into Inp must be two or more times greater than the current coming in from Inn for the comparator to be high. In other embodiments, the current sources (320, 330) may be set such the current into Inp must be greater than some other multiple of the current into Inn. This principle can be used to create an ADC that uses currents for references.

In a current-mode ADC, it may be advantageous to include one or more current-mode sample and hold ("S/H") circuits to ensure an accurate sampling and digital output. FIGS. 4-9 illustrate various embodiments of current mode S/H circuits that may be used in conjunction with the comparators of FIGS. 1-2 to implement a current mode ADC circuit. Exemplary current mode ADC circuits incorporating both S/H circuits and comparators are given further below, with particular regard to FIG. 10.

Figure 4:
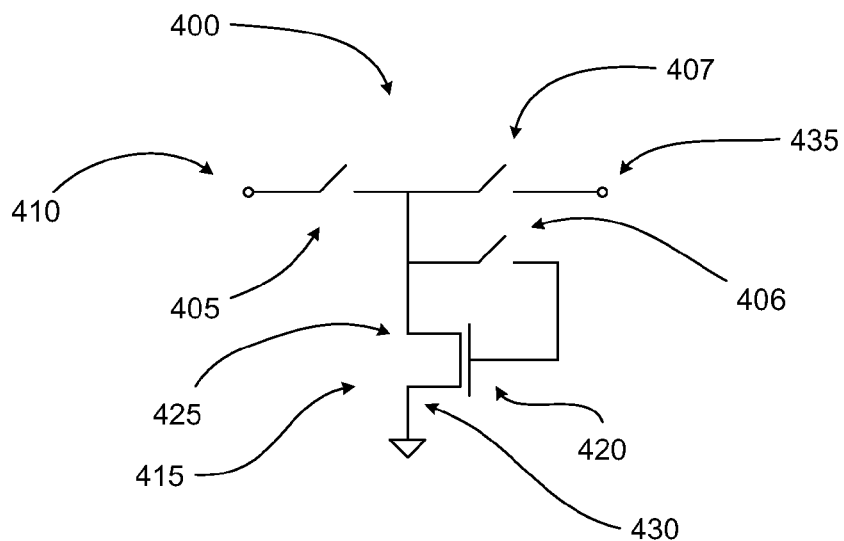
FIG. 4 shows an illustrative current mode sample and hold circuit, according to one exemplary embodiment of principles described herein.
Figure 5:
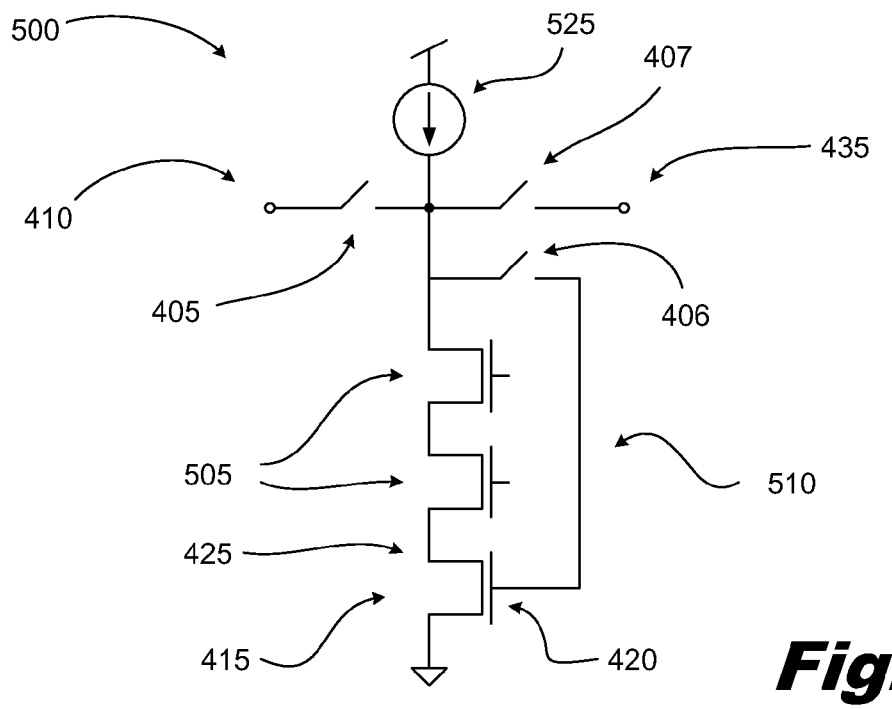
FIG. 5 shows an illustrative current mode sample and hold circuit, according to one exemplary embodiment of principles described herein.

FIGS. 4 and 5 illustrate possible embodiments of current mode S/H circuits. Current mode S/H circuits such as these may be considered current copiers because the circuits are capable of sampling an input and copying the current of that input to an output. The S/H circuit (400) of FIG. 4 has first, second, and third switches (405, 406, 407). When the first and second switches (405, 406) are closed, a signal from the input (410) to the circuit (400) is introduced into the circuit (400). The circuit (400) has an NMOS transistor having a gate (420) connected to the input (410) in addition to the transistor drain (425). This is commonly known in the art as a diode connected transistor (415). Because the two terminals are connected to the input (410), the transistor (415) begins to conduct the input signal between the drain (425) and the source (430). Also, because the drain (425) and gate (420) are connected, the circuit (400) may be able to set the gate voltage such that the transistor (415) conducts a current value equal to the input signal.

After the transistor (415) begins conducting the input signal, the first and second switches (405, 406) may be opened and the third switch (407) may be closed appropriately such that the transistor (415) draws current from an output (435) of the S/H circuit (400). The current that the transistor (415) draws from the output (435) is substantially equal to the current of the input signal. Aspects which may affect the current value drawn from the output (435) are the voltage at the transistor gate (420), the impedance of the transistor (415), the load impedance, the input impedance, the charge injection from the switches (405, 406, 407), and leakage currents, in addition to other characteristics of the S/H circuit (400) or connected components.

Referring now to FIG. 5, the current copier may also include a bias current source (525) connected to the S/H circuit (400) between the first and second switches (405, 406). The bias current source may provide more accuracy for the current copier and may help prevent errors from occurring when opening and closing switches when performing sampling and holding processes. In embodiments including such a bias current source, the current flowing through the diode connected transistor (415) during sampling is equal to the input current plus the bias current. As the S/H circuit (400) changes to holding the input signal, the bias current source is still connected to the signal pathway and continues to supply current to the diode connected transistor (415). Because the bias current continues to supply current, the diode connected transistor draws a current from the output equal to the current of the input signal so that the current flowing through the diode connected transistor (415) does not change. Ideally, the ratio of the impedance of the current source in parallel with the diode connected transistor (415) to the output impedance is high enough to prevent changes in the output voltage level.

The illustrative embodiment in FIG. 5 shows a slightly improved S/H circuit (500). The S/H circuit (500) may include a number of cascode devices (505) such as additional transistors in series with the diode connected transistor (415) that may increase the impedance of the diode connected transistor loop (510). The cascode devices (505) are within the diode connected transistor loop (510) such that if the third switch is open (407), the cascode devices (505) are not in operation and do not affect the rest of the circuit (500). While the drain (425) of the diode connected transistor (415) in the current embodiment is not connected directly to the gate (420), the additional transistors have a bias voltage which may turn them on independently of the rest of the circuit (500). The result of including the cascode devices (505) is a higher overall impedance of the transistor loop (510) in relation to the input impedance when sampling, or the impedance ratio between the impedance of the transistor loop (510) and the load impedance when holding. A higher impedance ratio between the transistor loop (510) and the load impedance may help maintain the voltage at the output (435) at a level in order to allow the current to be correctly copied from the input (410) to the output (435).

Figure 6:
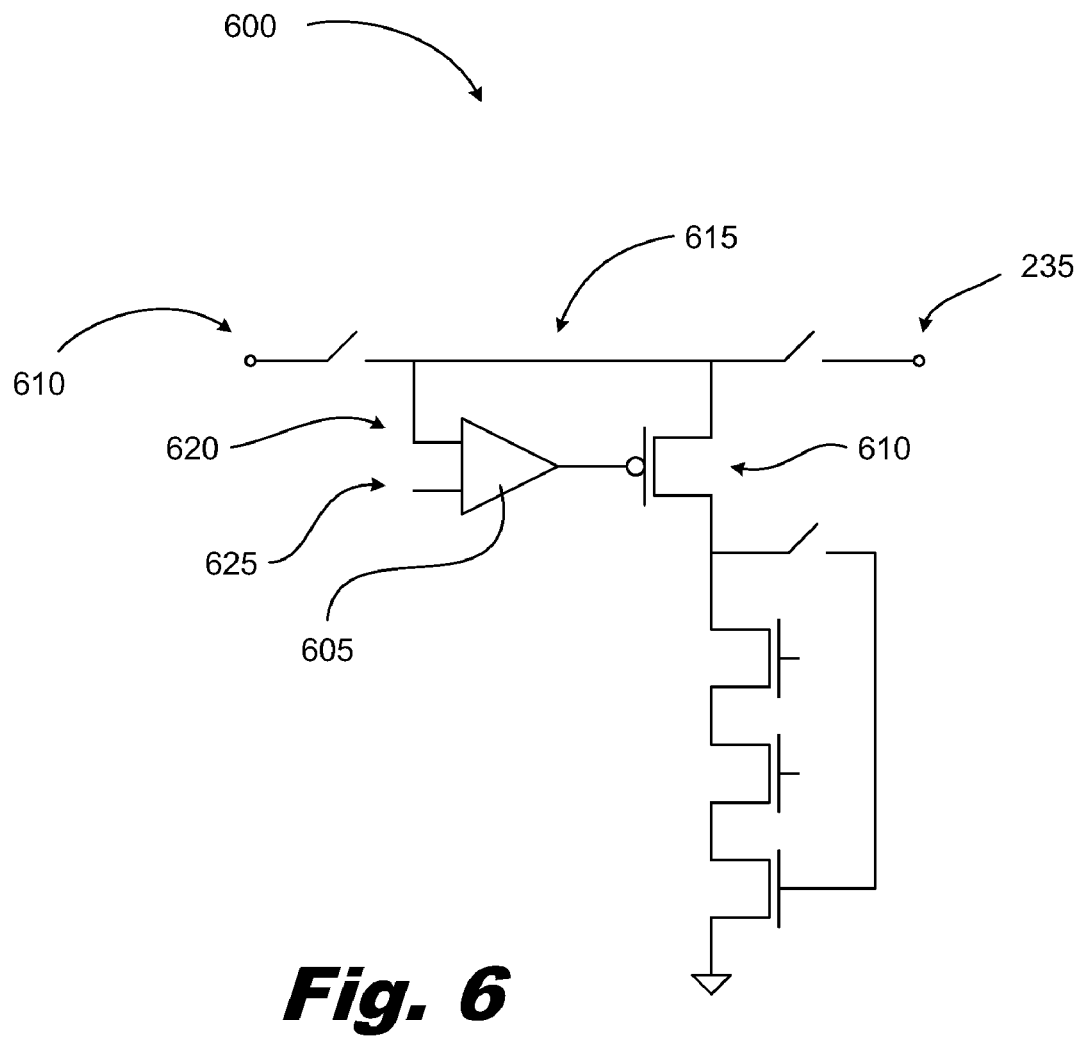
FIG. 6 shows an illustrative current mode sample and hold circuit, according to one exemplary embodiment of principles described herein.

FIG. 6 shows an illustrative embodiment of an improved current copier S/H circuit (600) including an operational amplifier (605) with its output connected to the gate of a PMOS transistor (610). Changes in voltage at the output (435) while sampling and holding can have a detrimental effect on the accuracy of the current copier. Consequently, it is desirable to have a means of maintaining the voltage at the output (435) at a fixed value throughout the sampling and holding process.

A feedback loop (615) to a first input (620) of the amplifier (605) is connected to a source of the PMOS transistor (610). A reference voltage is applied to a second input (625) of the amplifier (605). In this configuration, the amplifier (605) forces the voltage at the first input (620), which is connected to both the S/H circuit input (410) and output (435), to be a constant voltage. Thus, the charge injection of the switches (405, 406, 407) may be constant independent of the current of the input signal, and the input signal may be accurately copied to the output when the S/H circuit (600) is holding the signal. This embodiment is a single-ended circuit having only one input (410) and one output (435).

Figure 7:
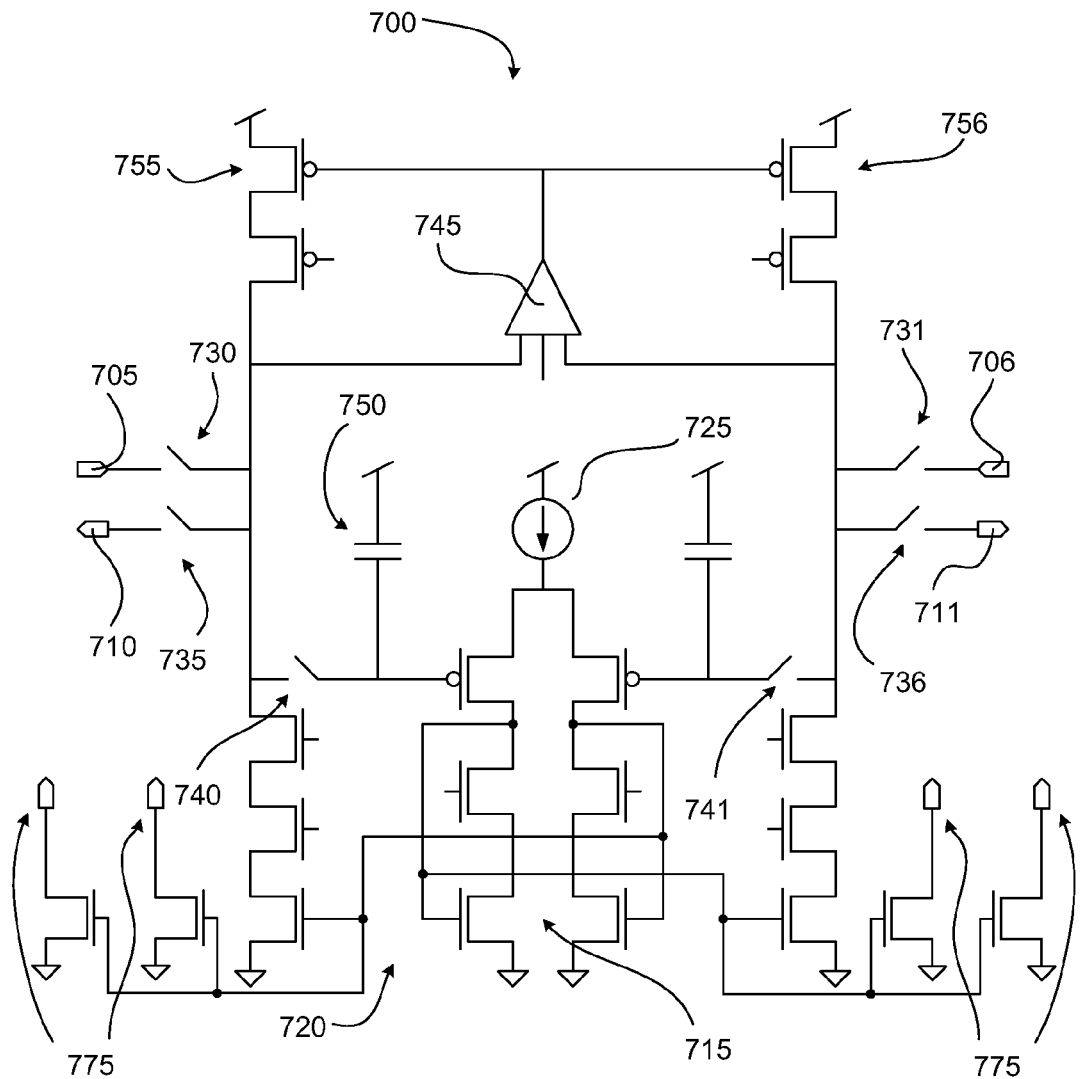
FIG. 7 shows an illustrative current mode sample and hold circuit, according to one exemplary embodiment of principles described herein.

The accuracy of the current copier may be improved over the one-ended circuit previously described by making the S/H circuit (700) fully differential, as illustrated in the embodiment of FIG. 7. The S/H circuit (700) may have first and second inputs (705, 706) and first and second differential outputs (710, 711) which are current copier outputs. The first input (705) and first differential output (710) are connected such that they have an equal voltage, and the second input (706) and second differential output (711) are connected such they also have an equal voltage. The differential circuit includes a crossover (715) and may include a number of current mirrors (720). A bias current source (725) is connected to the S/H circuit (700) in order to provide a bias current for the inputs (705, 706) and outputs (710, 711). The S/H circuit (700) may be designed to recognize changes in signal currents such that the circuit (700) may make adjustments accordingly. The S/H circuit (700) may be designed to operate with a wide range of frequencies, anywhere between about 20-500 MHz. In some embodiments, the S/H circuit (700) may be designed to operate with frequencies of approximately 150-200 MHz.

When the S/H circuit (700) is sampling, first and second switches (730, 731) at the inputs (705, 706) along with third and fourth switches (735, 736) are closed such that the current mirrors (720) conduct current. The bias current source (725) also provides current for the circuit (700). When the first, second, third, and fourth switches (730, 731, 735, 736) are opened, fifth and sixth switches (740, 741) are closed such that current may be drawn from the outputs (710, 711) and the S/H circuit (700) is placed in a holding state.

The S/H circuit (700) also has a common mode amplifier (CMA, 745), which may help maintain the voltages at both inputs (705, 706) at a generally equal value irrespective of the current values of both input signals. While it may be difficult to keep the voltage values at the inputs continuously equal, the CMA (745) may maintain the voltages at or near an average value, as determined by the reference voltage input to the common mode amplifier.

As discussed previously, the circuit may also include cascode devices (505) for increasing the impedance of the current mirrors (720) or of diode connected transistor loops. The circuit may also include capacitors (750), which may be used to reduce system noise and help reduce stabilizing time when sampling and holding a signal, which may be particularly helpful when dealing with small signal values.

The S/H circuit may also include a number of additional outputs (775) that are scaled up or down from the input. The scaling may be accomplished by current mirrors having devices that are scaled appropriately in order to achieve the desired output current range. These outputs (775) may be connected to the flash ADC (115), or used as a current output for testing or other purposes. The DAC output is then subtracted from the non-scaled outputs (710, 711) of the S/H circuit (700) to achieve the residue signal. The accuracy and signal to noise requirements of subsequent stages in the pipelined ADC (100) may not be as high as required by the first stage (105). The combination of current mirror outputs and current copier outputs as described in the current embodiment is particularly advantageous as described in FIG. 9 because it allows a plurality of S/H circuits to be used in a pipelined ADC.

Figure 8:
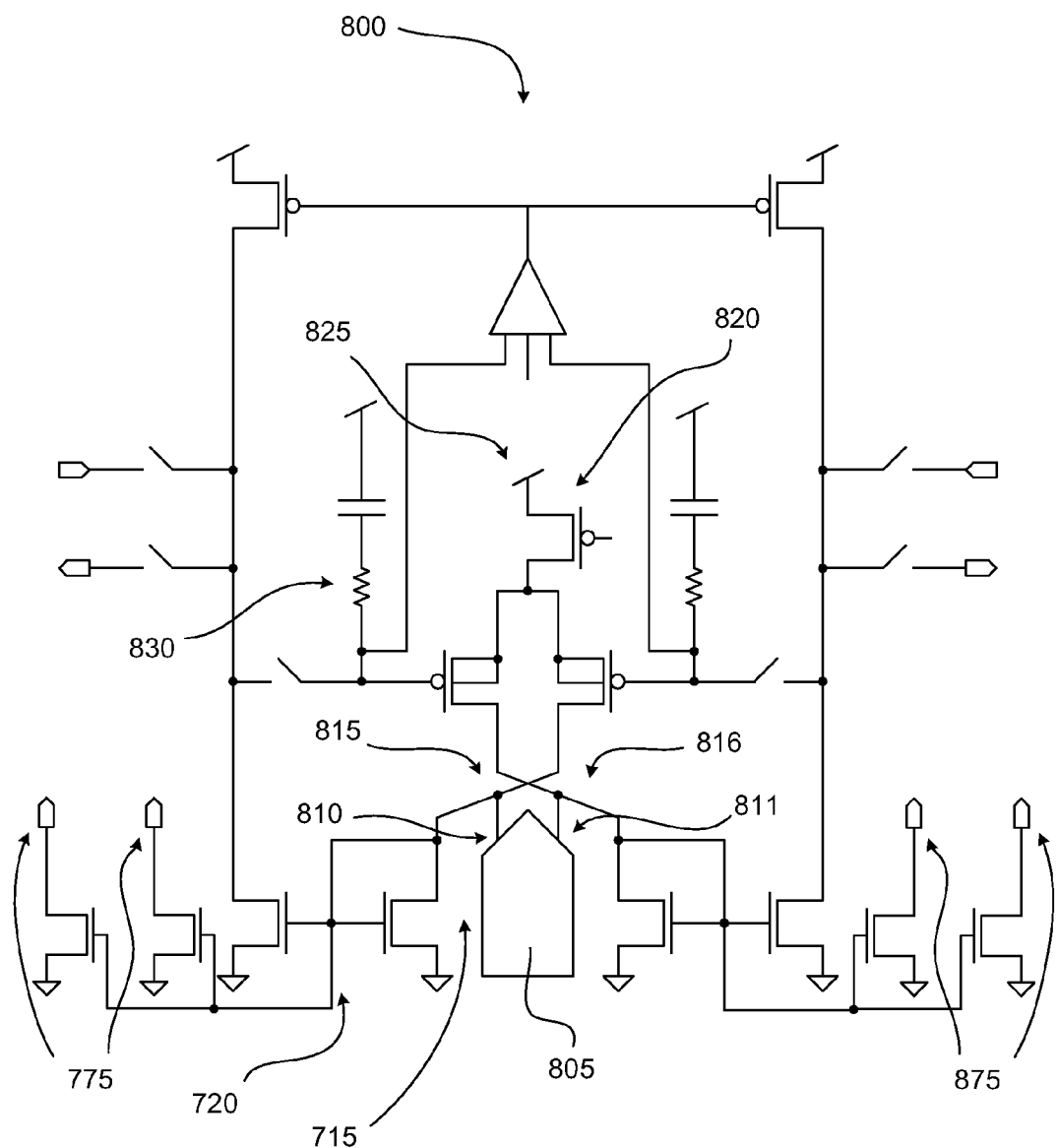
FIG. 8 shows an illustrative current mode sample and hold circuit, according to one exemplary embodiment of principles described herein.

The S/H circuit (800) may include a means for adjusting the current in either side of the circuit to correct for differences in component characteristics, as illustrated in the embodiment of FIG. 8. Ideally, the devices used for the S/H circuit (800) have exact characteristic matches with other devices of the same type and specification. For example, each NMOS transistor in the current mirrors (720) should have identical characteristics to the other NMOS transistors. However, in practice it is difficult to get exact matches between circuit devices, such as transistors, in integrated circuits due to the fabrication processes used to create them. Transistor parameters such as threshold voltage and beta (β) value are often characteristics in which the variance between transistors occurs. Gate oxide thickness plays a large part in device mismatch, particularly due to the inexact nature of growing oxide on a wafer. Variations in etching and ion implantation also cause errors in device mismatch.

The S/H circuit (800) in FIG. 8 has a DAC (805) attached to the crossover (715) of the circuit (800). The DAC (805) has two inputs (810, 811), a first input (810) attached to a first branch (815) of the crossover (715) and a second input (811) attached to a second branch (816) of the crossover (715). The DAC (805) is configured to adjust for current mismatches between the first and second branches (815, 816), such that if the current in the first branch (815) is higher than the current in the second branch (816), the DAC (805) will draw sufficient current from the first branch (815) such that the remaining current in the two branches is identical. Likewise, if the current in the second branch (816) is higher than the current in the first branch (815), the DAC (805) will draw sufficient current from the second branch (816) such that the remaining current in the two branches is identical.

A single PMOS transistor (820) may be used to create a bias current source in some embodiments, where the source of the transistor is tied to a supply voltage (825). The S/H circuit (800) may also include as many or as few transistors or other cascode devices as required by the circuit to provide an accurate current match between the sampling and holding states of the circuit. The S/H circuit (800) may include resistors (830) or other components that may be used in conjunction with capacitors in order to improve performance characteristics of the circuit. The resistors (830) may help the transistor gate voltage charge faster for quicker response, though the resistors (830) should be chosen such that they do not interfere too much with the signal to noise ratio.

Figure 9:
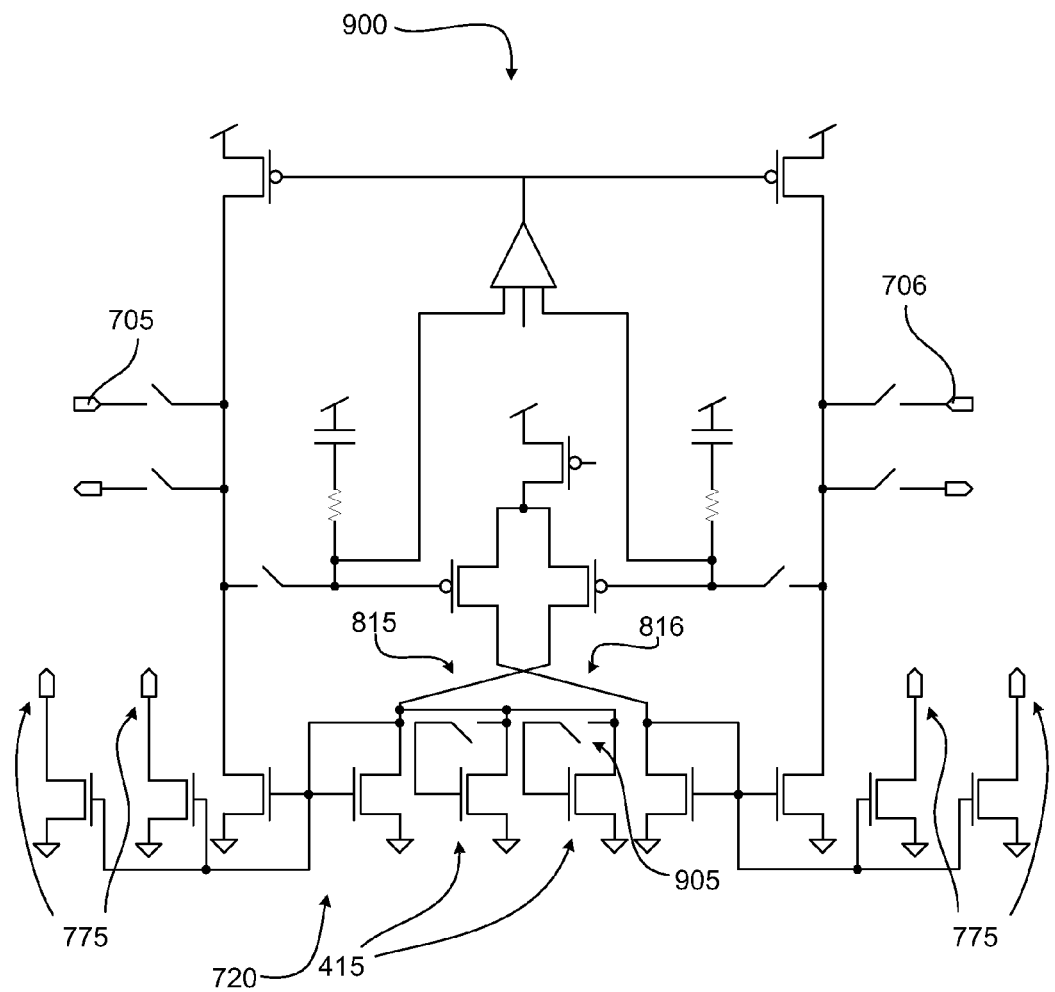
FIG. 9 shows an illustrative current mode sample and hold circuit, according to one exemplary embodiment of principles described herein.

FIG. 9 shows an alternative embodiment of a S/H circuit (900) with a means for correcting for differences in device characteristics. A first branch (815) of the crossover (715) of the S/H circuit (900) may be connected to a number of diode connected transistors (415) in parallel with a current mirror (720). Diode connected transistors (415) in parallel with the current mirror (720) are configured to adjust the characteristics of the first branch (815) of the crossover (715) to match the characteristics of the second branch (816) of the crossover (715). As many or as few diode connected transistors (415) may be connected in parallel with the current mirror (720) as are needed to match the characteristics of the first and second branches (815, 816) of the crossover (715). The diode connected transistors (415) may have switches (905) such that when the switches (905) are closed, the diode connected transistors (415) are able to conduct current from the inputs (705, 706) when the S/H circuit (900) is in a sampling state, and when the switches (905) are opened and the S/H circuit (900) is in a holding state, the transistors (415) are held at a steady current.

Additional information and embodiments for current-mode sample and hold circuitry can be found in U.S. Pat. No. 7,733,254 to Kent F. Smith et al., entitled "Sample and Hold Circuit for a Current Mode Pipelined Analog-to-Digital Converter," the entire disclosure of which is incorporated herein by reference.

Figure 10:
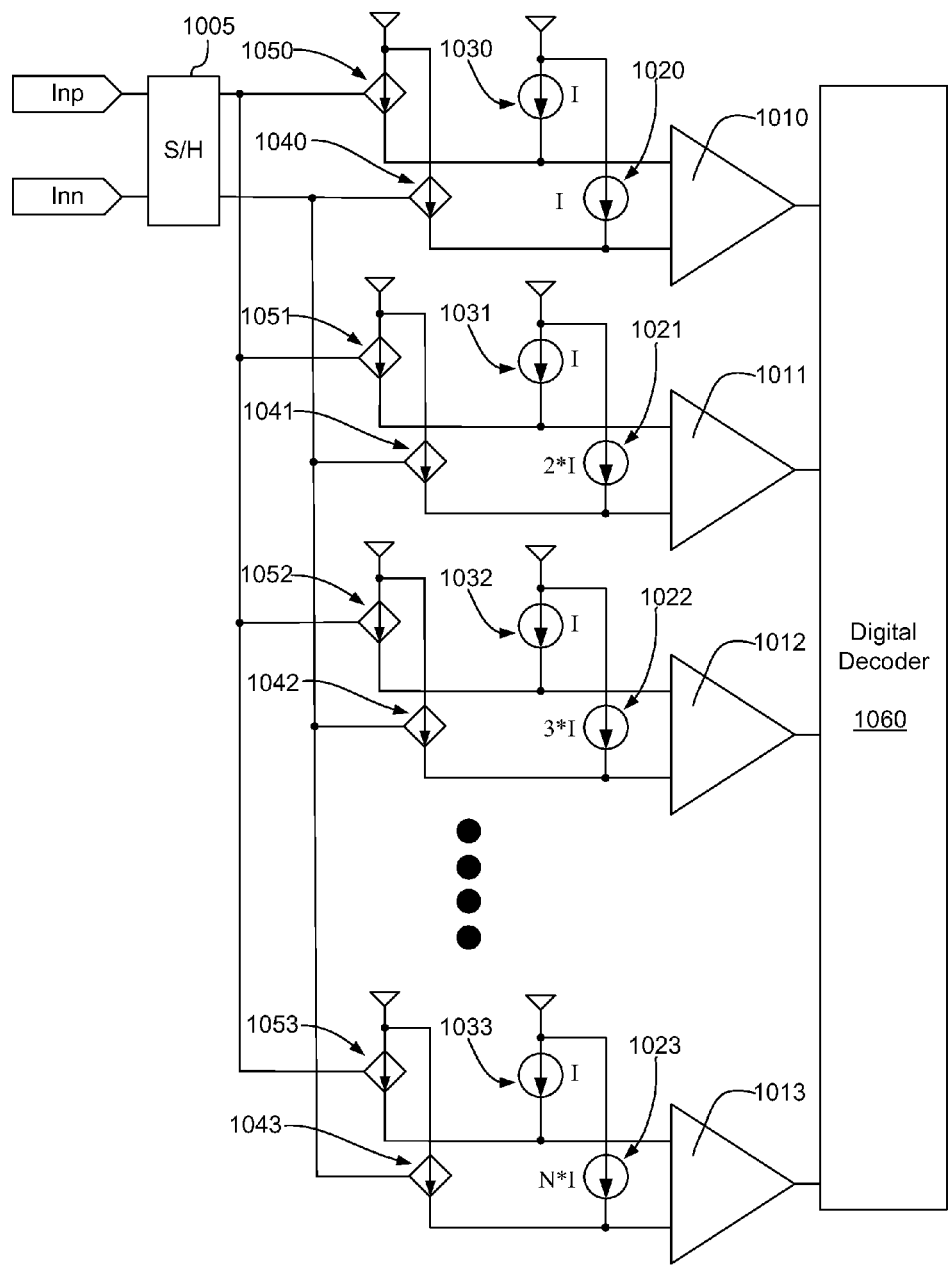
FIG. 10 shows an illustrative current mode ADC according to one exemplary embodiment of principles described herein.

FIG. 10 shows an n bit, current-mode ADC. The current-mode ADC of the present example includes two current input nodes (Inp, Inn)—a positive current input node (Inp) and a negative current input node (Inn). The ADC shown in FIG. 10 can be used with various types of input stages, depending on a desired application. Using a first exemplary input stage the current being measured flows between Inp and Inn with an impedance close to 0 ohms (i.e. externally the nodes appear to be shorted together). A second exemplary type of input stage is similar to the first, except the impedance between Inp and Inn is controlled to a value that can create a current divider with an external impedance. Using this type of stage, impedance matching can be done, as well as measurement of very large currents, where the full current now does not have to flow through the ADC to be measured. In a third exemplary type of input stage, the impedance between Inp and Inn is very high. Thus, currents do not flow directly between the nodes. In this case the current measured is Inp minus Inn, but Inp does not have to be equal and opposite of Inn.

Current at the input nodes (Inp, Inn) is sampled by one or more current-mode sample-and-hold circuits (1005, 1007) which output an electrical current having an analog value proportional to a sampled analog value of the input current to be measured, consistent with the principles described above. Current comparators (1010), (1011), (1012) and (1013) are connected to a digital decoder (1060). The comparator of FIG. 2 may be used as the comparators (1010-1013). The comparators (1010-1013) take current inputs and convert them to a digital output as described above. Elements (1030), (1031), (1032), and (1033) are current sources that add a DC bias to the input signal. Elements (1020), (1021), (1022), and (1023) are current sources with output currents scaled from I to N*I, where N is equal to 2^n. Because the inputs to the comparators (1030-1033) are currents, elements (1040), (1041), (1042), and (1043) are current controlled current sources having current equal to Inp and Inn respectively, to allow for combining the currents into the comparators.

The digital decoder (1060) shown in FIG. 10 is a digital, thermometer code to binary converter which takes the data from the N comparators and converts the data into an n bit binary signal. The digital decoder (1060) may also contain error detection or correction circuitry.

Figure 11:
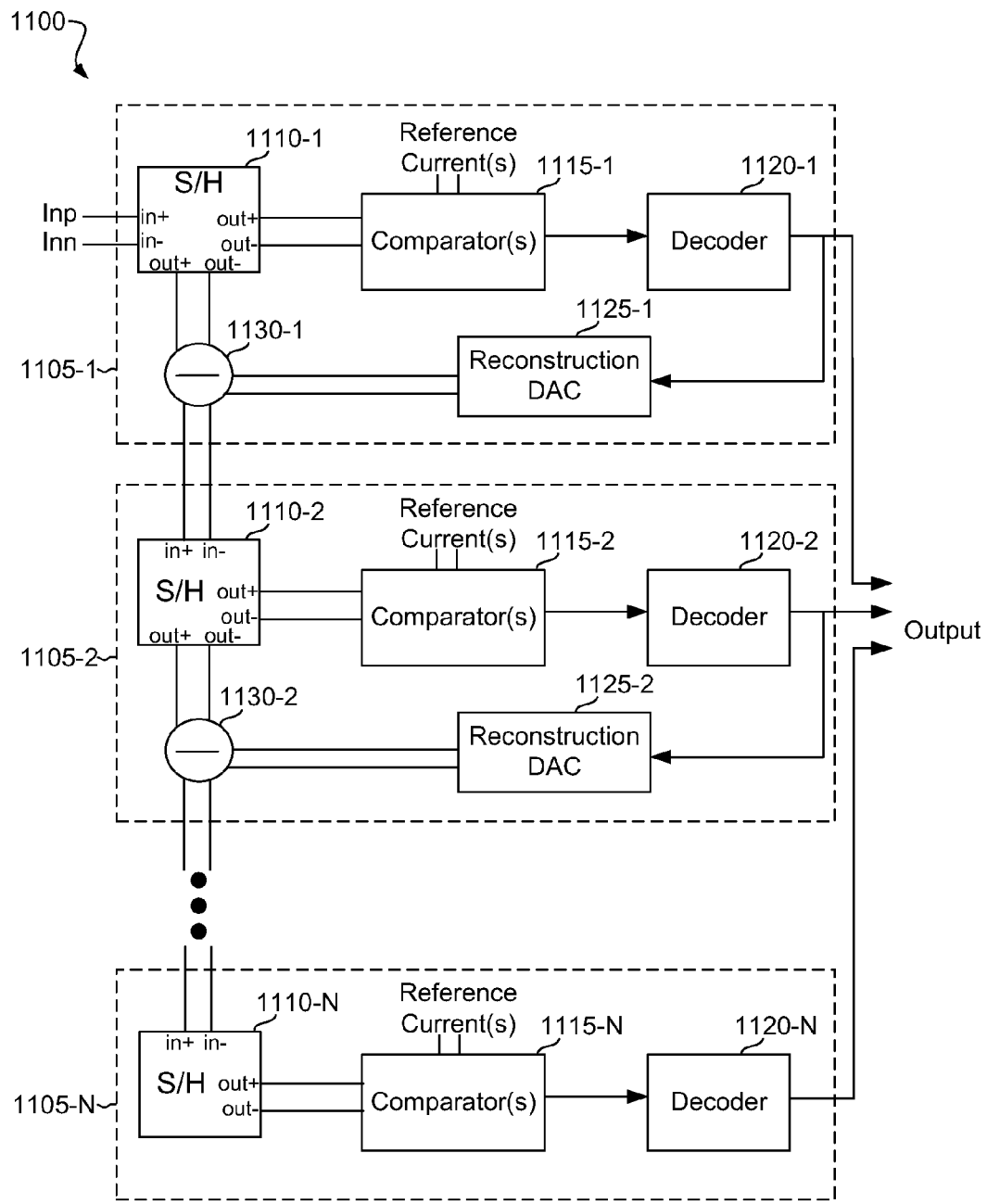
FIG. 11 shows an illustrative multi-stage pipelined current-mode ADC according to one exemplary embodiment of principles described herein.

FIG. 11 illustrates an illustrative embodiment of a multi-stage pipelined current-mode ADC converter (1100) consistent with the principles described herein. The ADC converter (1100) has N pipelined stages (1105-1 to 1105-N), each of which provides a portion of the digital output signal.

When a current to be measured (i.e., an input current) is received at an input node of the first stage (1105-1), at least one current-mode sample and hold circuit (1110-1) samples the analog value of the input current and provides an electrical current proportional to the sampled analog value of the input current at two independent outputs. The first output node of the sample and hold circuit (1110-1) is received by at least one comparator (1115-1) which compares the output of the sample and hold circuit (1110-1) to one or more reference currents and outputs a digital representation of the comparison to a decoder (1120-1). The second output node of the sample and hold circuit (1110-1) is received by a subtraction block (1130-1 to 1130-2), as will be explained in more detail below. In certain examples, the first and second outputs may be scaled such to output the same output current in response to the same input current. Alternatively, the first and second outputs may be scaled to output different output currents in response to the same input current.

In some examples, the comparator(s) block (1115-1) and the decoder block (1120-1) shown in FIG. 11 are implemented by the array of comparators (1010 to 1013), the current sources (1020 to 1033) corresponding to the comparators (1010 to 1013), and the digital decoder (1060) shown in FIG. 10, respectively. The digital representation of the sampled input current provided by the decoder (1120-1) becomes part of the final digital signal output from the multi-stage current-mode ADC converter (1100).

Each of the stages (1105-1 to 1105-N) includes at least one current-mode sample and hold circuit (1110-1 to 1110-N), at least one comparator circuit (1115-1 to 1115-N), and a decoder circuit (1120-1 to 1120-N) as described with reference to the first stage (1105-1). Additionally, all but the last stage (1105-N) includes a reconstruction digital to analog converter (DAC) (1125-1 to 1125-2) and subtraction circuitry (1130-1 to 1130-2). The reconstruction digital to analog converter DAC (1125-1 to 1125-2) reconstructs an analog current from the digital output of its respective decoder (1120-1 to 1120-2) and outputs the reconstructed analog current to the respective subtraction circuitry (1130-1 to 1130-2). The subtraction circuitry (1130-1 to 1130-2) subtracts the reconstructed current from the current at the second output of the respective sample and hold block (1110-1 to 1110-2). The result of this subtraction becomes the input current to the next stage (1105-2 to 1105-N) of the pipeline.

The subtraction circuitry (1130-1 to 1130-2) may be implemented by any current-mode adder or current-mode differential amplifier that may suit a particular application of the principles described herein.

Figure 12:
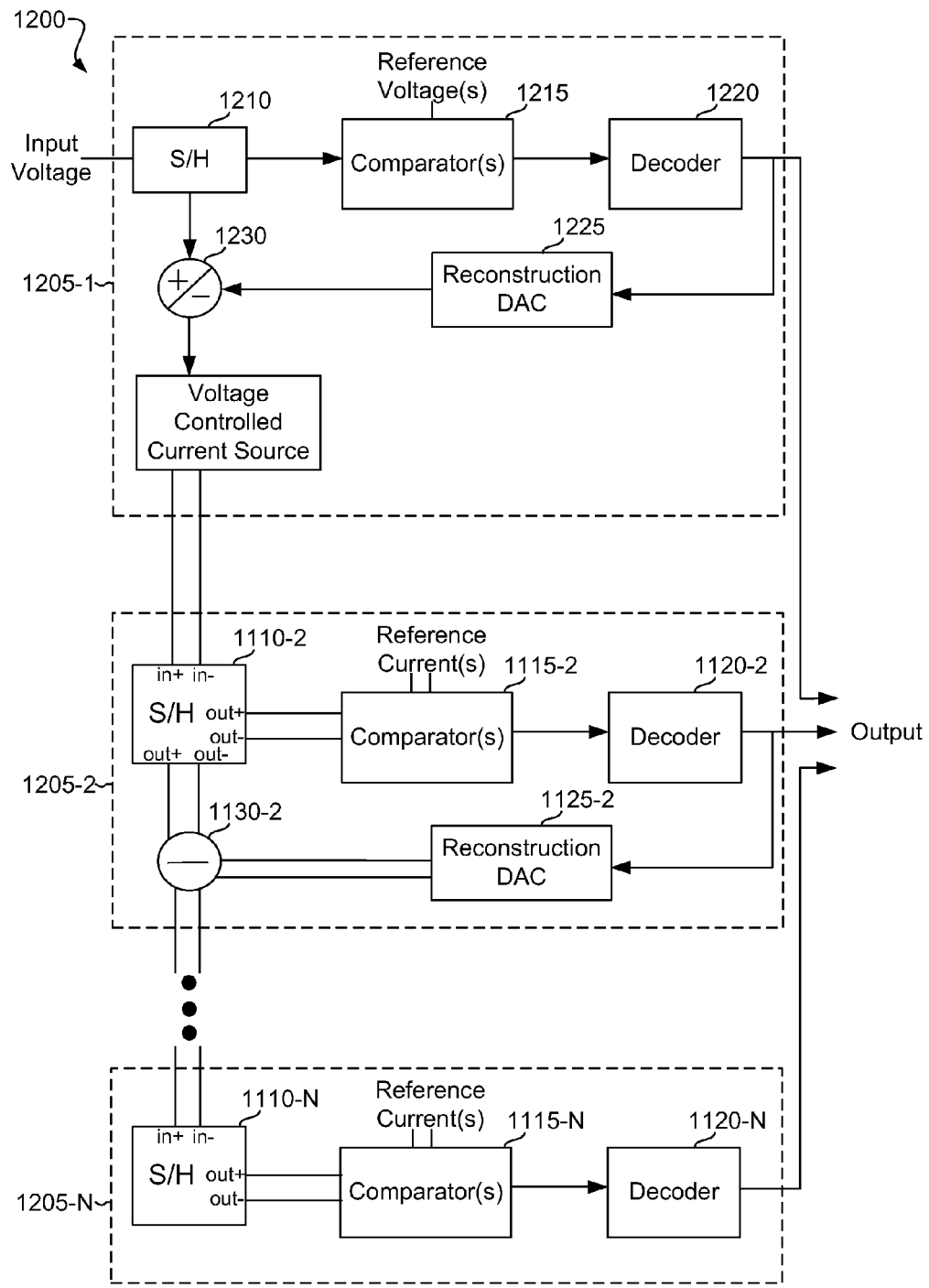
FIG. 12 shows an illustrative multi-stage pipelined ADC according to one exemplary embodiment of principles described herein.

FIG. 12 illustrates an illustrative multi-stage pipelined ADC (1200) in which the first stage (1205-1) of the ADC (1200) includes a voltage-mode sample and hold circuit (1210) that samples an input voltage and provides an output voltage which is proportional to the sampled input voltage to one or more comparators (1215) and to subtraction circuitry (1230). Because of the nature of voltage-mode circuitry, the sample and hold circuitry (1210) may use a single output or two independent outputs.

The one or more comparators (1215) compare the voltage output from the sample and hold circuitry (1210) to one or more reference voltages and output a digital representation of the result of the comparison to a decoder (1220). The digital representation of the decoder (1220) from the first stage (1205-1) may be combined with the digital representations from decoders (1120-2 to 1120-N) of the current-mode stages of the ADC (1200). Alternatively, the digital representation of the decoder (1220) from the first stage (1205-1) may be routed to a destination separate from that of the digital representations output from the decoders (1120-2 to 1120-N) of the current-mode stages (1205-2 to 1205-N).

A reconstruction DAC (1225) also receives the digital representation from the decoder (1220) and reconstructs the digital representation to an analog voltage which is subtracted from the voltage output of the sample and hold circuitry (1210) using voltage-mode subtraction circuitry (1230). This voltage-mode subtraction circuitry (1230) may be implemented using, for example, a differential mode amplifier or any other voltage subtraction circuitry that may suit a particular application of the principles described herein.

The voltage result of the subtraction from the voltage-mode subtraction circuitry (1230) is then provided to a voltage controlled current source (1235), which converts the voltage result into a current. This voltage controlled current source (1235) may be implemented by a transconductance amplifier, an analog to digital converter coupled to a current source, or any other type of voltage controlled current source (1235) that may suit a particular application of the principles described herein. The output of the voltage controlled current source (1235) becomes the input of the second stage (1205-2), which is the first current-mode stage of the ADC (1200). The remaining current-mode stages (1205-2 to 1205-N) behave as described with respect to FIG. 11.

Alternatively, the second stage of the ADC (1200) may be another voltage-mode stage similar to the first voltage mode stage (1205-1). In this example, no conversion of the residue voltage to a current may be necessary, as the first stage (1205-1) may simply output the residue voltage to an input voltage node of the second stage of the analog-to-digital converter (1200).

In additional examples, various other arrangements of voltage-mode and current-mode stages are possible, and any of these arrangements may be used that best suits a particular embodiment of the principles described herein. By converting a residue voltage to a residue current, a voltage-mode stage may output to a next current-mode stage in the pipeline. Similarly, by converting a residue current to a residue voltage, a current-mode stage may output to a next voltage-mode stage in the pipeline.

Additional details related to current mode ADCs are described more fully in U.S. Patent Publication 20060017598, entitled "Current Mode Analog-to-Digital Converter," which publication is incorporated herein by reference in its entirety.

A number of exemplary systems utilizing current mode ADCs will now be described.

It is to be understood that the embodiments of current mode ADCs described in FIGS. 1-12 are by way of example only, and many other embodiments of current mode ADCs are suitable and contemplated for use with the systems and methods of the present specification.

Figure 13A:
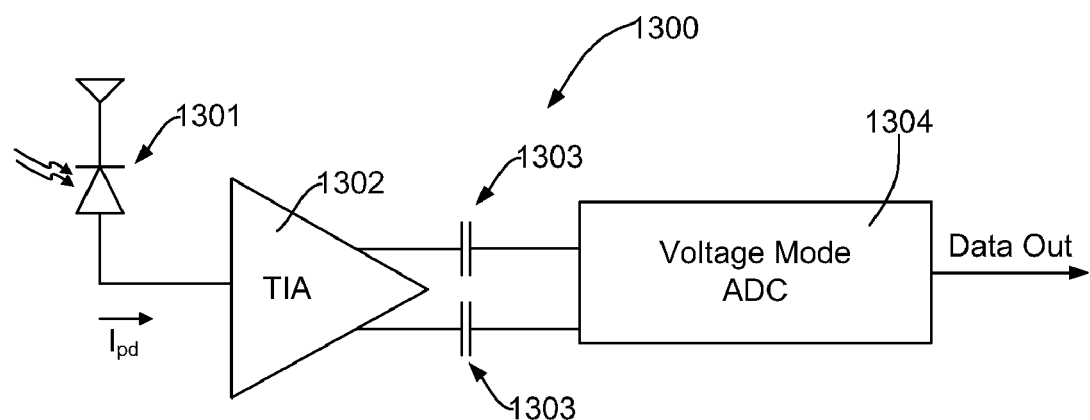
FIG. 13A shows an illustrative photodiode system according to one exemplary embodiment of principles described herein.

FIG. 13A illustrates an exemplary photodiode detection system (1300) that uses a standard voltage mode ADC (1304). As shown in FIG. 13A, the system (1300) includes a photodiode (1301) in communication with an input node of a transimpedance amplifier (TIA) (1302). The photodiode detection system (1300) also includes series capacitors (1303) in communication with output nodes of the transimpedance amplifier (1302) and input nodes of the standard voltage mode ADC (1304). Photodiodes (1301) are used in many fiber optic implementations, for example.

However, as shown in FIG. 13A, current (Ipd) is inherently output from the photodiode (1301). This current typically has a small signal level, and therefore has to be amplified by the amplifier (1302) and converted into a voltage prior to being input into the ADC (1304). Hence, in some examples, a current mode ADC may be used in place of the standard ADC (1304) in order to obviate the need for the amplifier (1302).

Figure 13B:
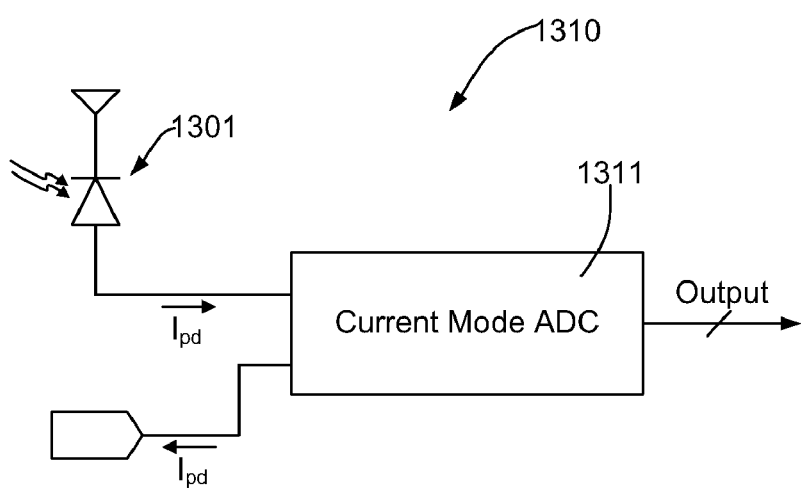
FIG. 13B shows an illustrative photodiode system that uses a current mode ADC according to one exemplary embodiment of principles described herein.

Therefore, as shown in FIG. 13B, a current mode ADC (1311) may be included within a photodiode detection system (1310). The current mode ADC (1311) is configured to be able to receive input current signals without the need for amplification or voltage conversion. Hence, the number of components required in the system is reduced, less power is consumed, higher operating speeds are possible, and higher accuracy may be achieved.

The current mode ADC (1311) is configured to receive the current (Ipd) produced by a photodiode (1301) at an input node of the current mode ADC (1311). A reference current (not shown) may also be received at an input node of the current mode ADC (1311). The current mode ADC (1311) is configured to output a binary electronic signal indicative of the amount of current measured from the photodiode (1301).

Figure 14A:
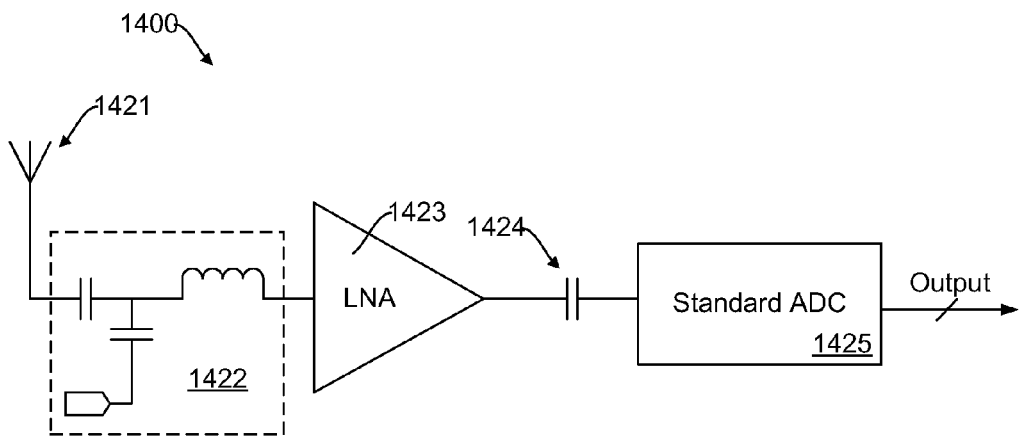
FIG. 14A shows an illustrative receiver system according to one exemplary embodiment of principles described herein.

FIG. 14A illustrates an exemplary receiver system (1400) configured to receive one or more radio antenna signals. As shown in FIG. 14A, the exemplary system (1400) includes an antenna (1421) in communication with filter circuitry (1422) and a low noise amplifier (LNA) (1423) configured to receive a filtered electrical signal from the antenna (1421). A series capacitor (1424) is disposed intermediate, and in electrical communication with an output of the LNA (1423) and an input of a standard voltage-mode ADC (1425). As shown in FIG. 14A, the signal received by the antenna (1421) typically has to be amplified with a low noise amplifier (1423) and then converted into voltages prior to being input into the ADC (1425).

Figure 14B:
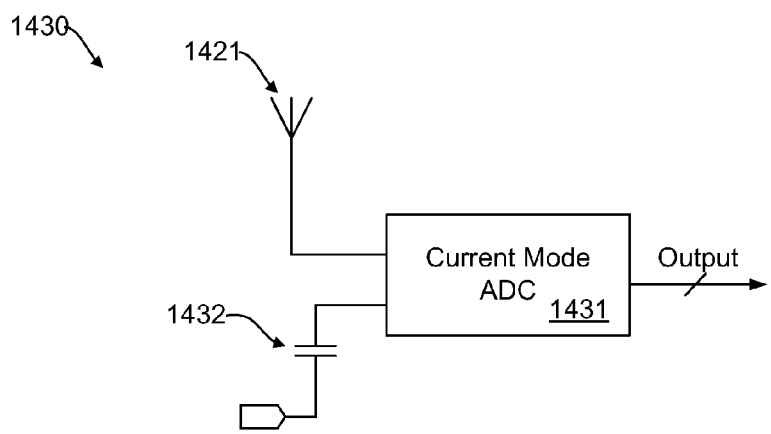
FIG. 14B shows an illustrative receiver system that includes a current mode ADC according to one exemplary embodiment of principles described herein.

FIG. 14B illustrates an exemplary receiver system (1430) that includes a current mode ADC (1431). In some examples, the current mode ADC (1431) may configured to have a controlled impedance to allow for radio signals received by the antenna (1421) to be input directly into the ADC (1431). Hence, the need for the LNA (1423) is obviated, system layout is simplified, and overall cost of the system is reduced.

Figure 15A:
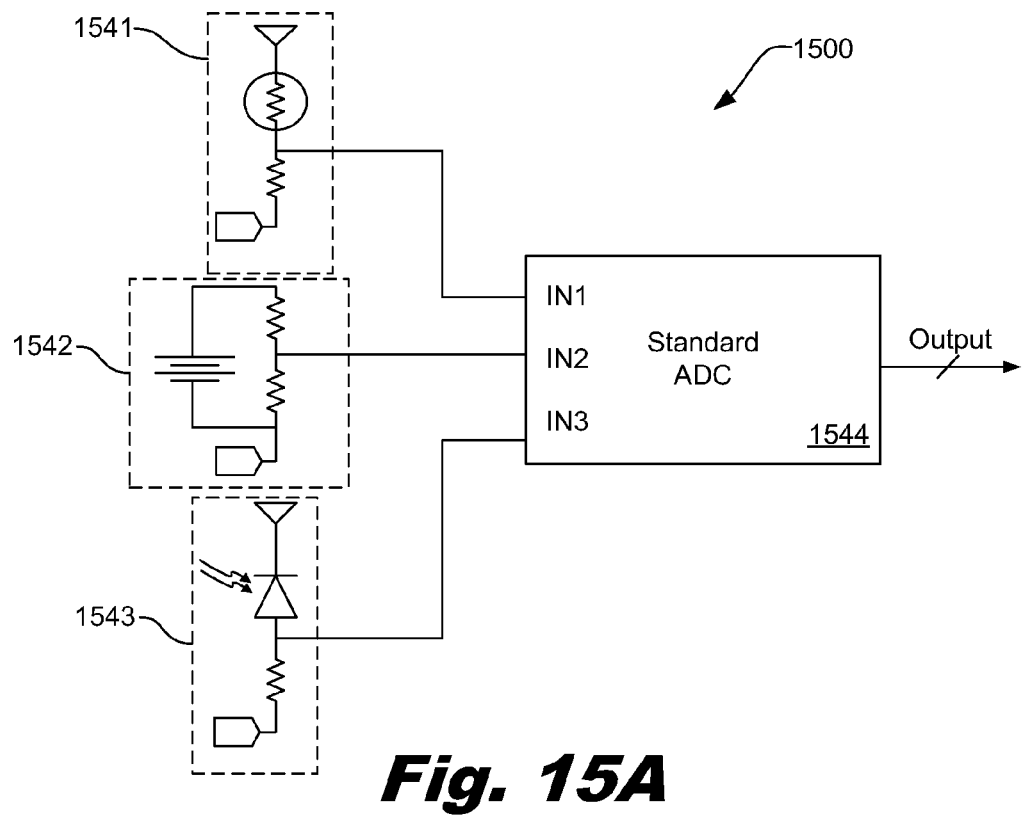
FIG. 15A shows an illustrative embedded system according to one exemplary embodiment of principles described herein.

FIG. 15A illustrates an exemplary embedded system (1500) that uses a standard voltage mode ADC (1544). Such an embedded system (1500) may be included in many different types of electronic devices such as, but not limited to, handheld devices (e.g., personal digital assistants (PDAs)), laptops, and others. As shown in FIG. 15A, the embedded system (1500) may include a number of components configured to perform different functions. For example, temperature circuitry (1541) may be used to sense internal temperature, battery level circuitry (1542) may be used to sense the battery level of the device, and an ambient light sensor (1543) may be configured to sense the level of ambient light and adjust the intensity of the device's display accordingly. An output from each circuit may then be input into the standard ADC (1544) after being converted to voltages using resistors.

Figure 15B:
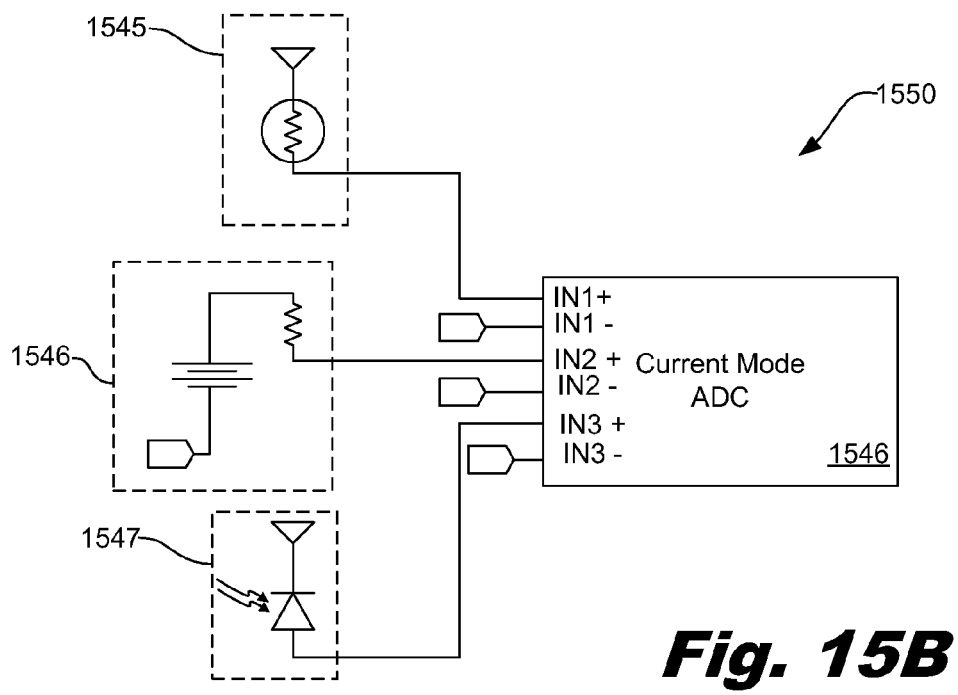
FIG. 15B shows an illustrative embedded system that includes a current mode ADC according to one exemplary embodiment of principles described herein.

FIG. 15B illustrates an exemplary embedded system (1550) with a current mode ADC (1546) contained therein. The current mode ADC (1546) allows fewer components to be used, saves space, lowers cost, and improves accuracy. The current mode ADC (1550) does not require current signals to be converted to voltage signals prior to sensing the signals. Hence, additional resistors need not be used in temperature circuitry (1545), battery level circuitry (1546), and ambient light detection circuitry (1547) having components configured to output a level of electric current relative to corresponding parameters of interest.

Figure 16A:
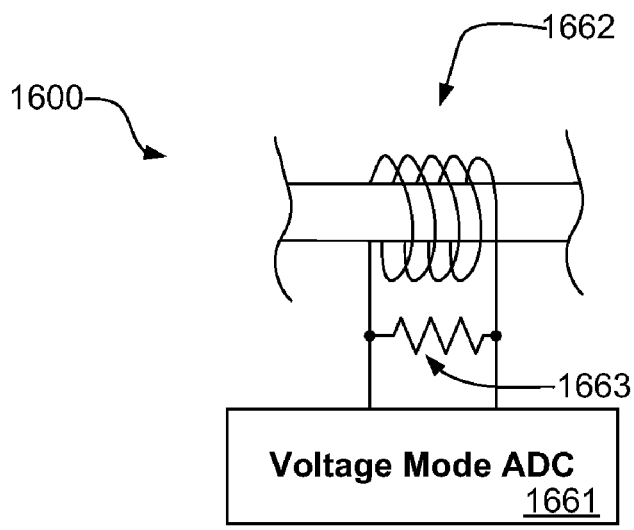
FIG. 16A shows an illustrative AC power metering system according to one exemplary embodiment of principles described herein.

FIG. 16A illustrates an exemplary AC power metering system (1600) that includes a standard voltage mode ADC (1661). To generate enough voltage for correct and accurate operation of a voltage mode ADC (1661), an expensive current mode transformer (1662) with a relatively large number of windings must be used. For high power, this also results in a potentially large load resistor (1663).

Figure 16B:
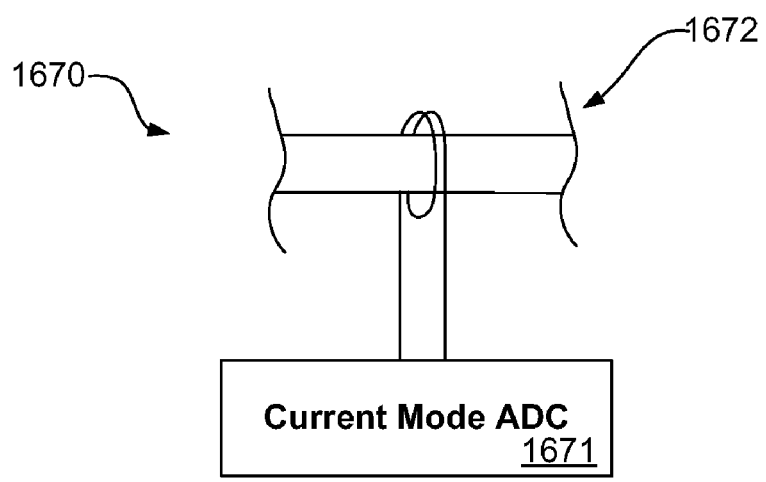
FIG. 16B shows an illustrative AC power metering system that includes a current mode ADC according to one exemplary embodiment of principles described herein.

However, FIG. 16B illustrates an exemplary AC power metering system (1670) that uses a current mode ADC (1671). Because the current mode ADC (1671) can accurately read even very small currents, the current transformer (1672) only has to have a relatively few number of windings. Thus, the AC power metering system (1670) of FIG. 16B provides a much more inexpensive and efficient solution than the system (1600) shown in FIG. 16A.

Figure 17A:
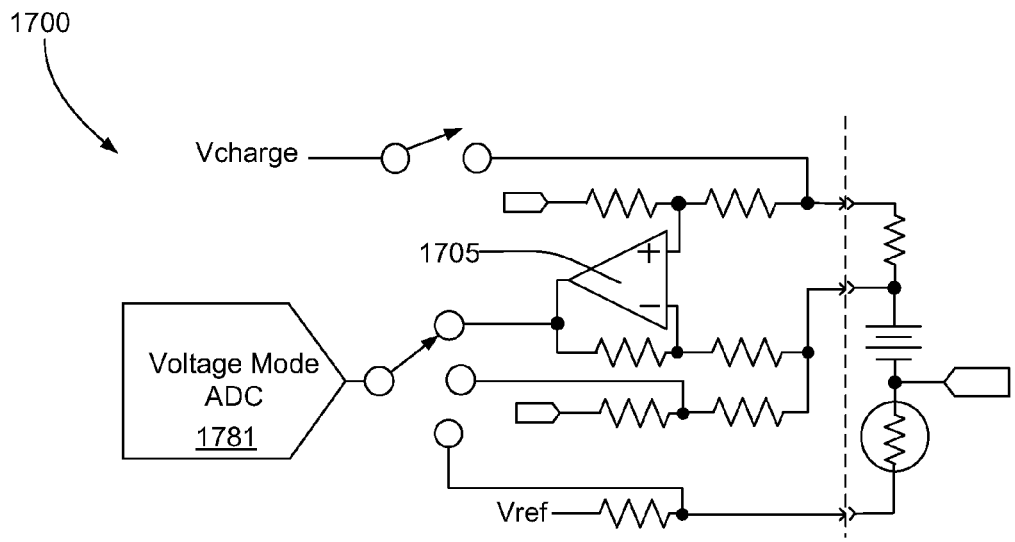
FIG. 17A shows an illustrative battery charging application according to one exemplary embodiment of principles described herein.

FIG. 17A illustrates an exemplary battery charging application (1700) that includes a standard voltage mode ADC (1781). As a battery (1710) is charged by Vcharge, voltage signals converted from current derived from the battery (1710) and a temperature sensor (1715) may be selectively measured by the voltage mode ADC (1781) using switches. The exemplary system (1700) requires an amplifier (1705) to provide a correct voltage sample at the voltage mode ADC (1781). The amplifier (1705) and additional resistors are required to convert the current signals from the battery (1710) and the temperature sensor (1715) to voltage signals that may be measured by the voltage mode ADC (1781).

Figure 17B:
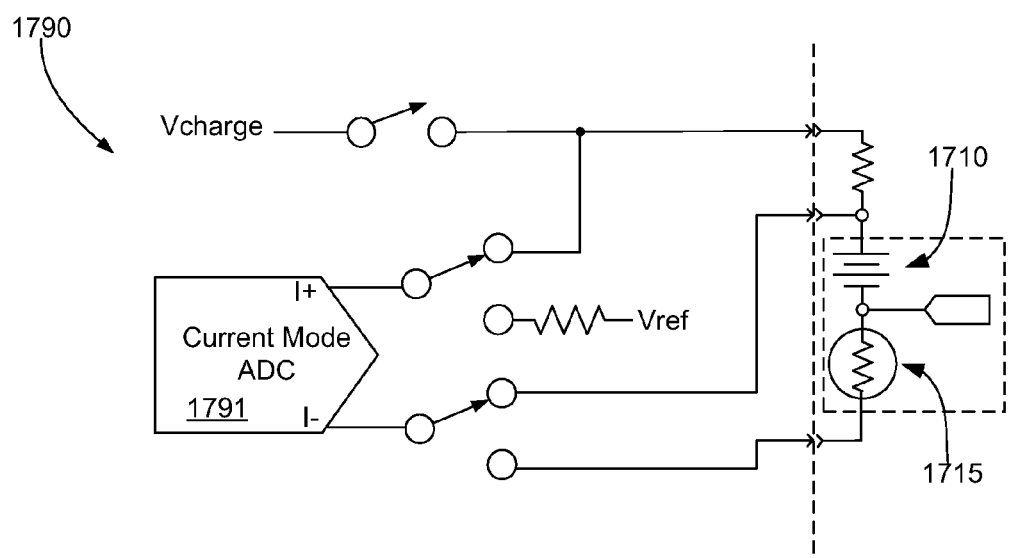
FIG. 17B shows an illustrative battery charging application that includes a current mode ADC according to one exemplary embodiment of principles described herein.

FIG. 17B illustrates an exemplary battery charging application (1790) that includes a current mode ADC (1791). As shown in the figures, the current mode ADC (1791) reduces the required amount of circuitry by accepting current signals directly from the battery (1710) and temperature sensor (1715) circuits. Moreover, current may be measured in parallel with a current limiting resistor (1792) and Voltage and Temperature measurements may be performed with I+ switched to Vref.

Figure 18:
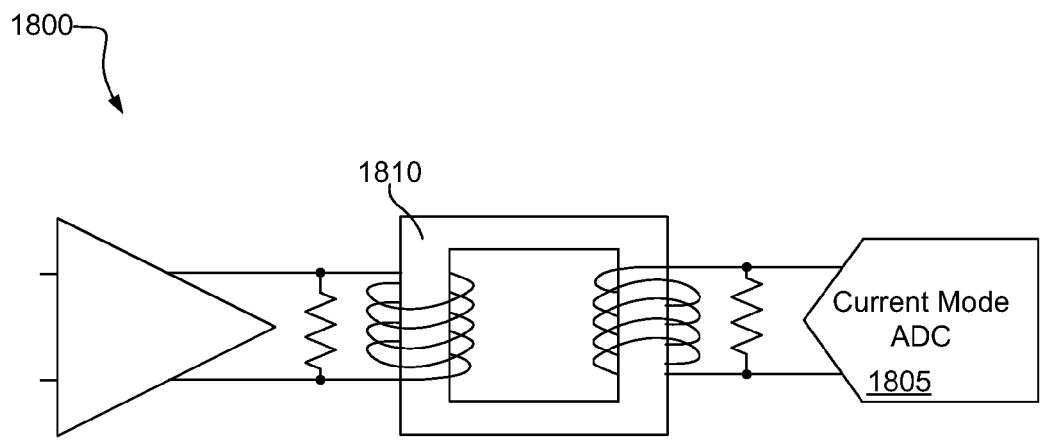
FIGS. 18-19 show additional or alternative illustrative systems in which current mode ADCs may be used according to one exemplary embodiment of principles described herein.
Figure 19:
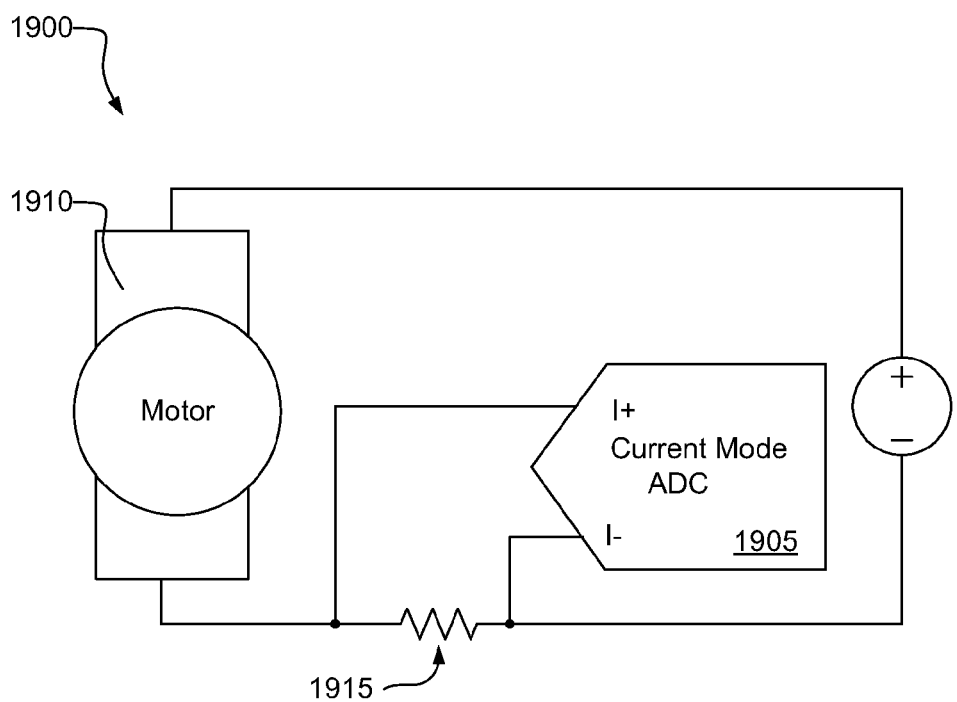

FIGS. 18-19 illustrate additional or alternative systems in which current mode ADCs may be used. For example, as shown in FIG. 18, an exemplary system (1800) includes a current mode ADC (1805) configured for use in transformer-based differential signal applications. The current mode ADC (1805) has an input impedance that may be designed to impedance match high frequency signals, such as those coming from a transformer (1810).

FIG. 19 illustrates an exemplary configuration wherein a current mode ADC (1905) is used in a DC motor monitoring system. Current draw from an electric motor (1910) may be monitored by a current divider formed across a normal current sense resistor (1915), as shown in FIG. 19.

The exemplary systems that use current mode ADCs described herein are merely exemplary of the many different systems that may be used with current mode ADCs. Hence, the scope of the present application includes all systems that include current mode ADCs having the architecture described herein.

The preceding description has been presented only to illustrate and describe embodiments of the invention. It is not intended to be exhaustive or to limit the invention to any precise form disclosed. Many modifications and variations are possible in light of the above teaching.

What is claimed is:

1. A pipelined current-mode analog to digital converter comprising a number of stages, a first stage of said current-mode analog to digital converter comprising:
    a current input node;
    a current-mode sample and hold circuit configured to output an electrical current having an analog value proportional to a sampled analog value of an electrical current at the current input node wherein the current-mode sample and hold circuit comprises a plurality of output nodes, each of said output nodes outputting a separate electrical current having an analog value proportional to the sampled analog value of the electrical current at the current input node; and
    at least one current comparator configured to compare the electrical current output by the current-mode sample and hold circuit to at least one reference current to produce a digital representation of the sampled analog value of the electrical current at the current input node.

2. The current-mode analog to digital converter of claim 1, wherein a path between an output of said current mode sample and hold current and a digital to analog converter to create an analog representation of said digital representation does not include a current mirror.

3. The current-mode analog to digital converter of claim 2, wherein a first stage of the analog-to-digital converter comprises circuitry that receives an input signal, produces a digital representation of a sampled voltage of the input signal, reconstructs an analog voltage based on the digital representation of the sampled voltage, subtracts the reconstructed analog voltage from the sampled voltage of the input signal to produce a residue voltage, converts the residue voltage to a residue current, and outputs the residue current to the current input node.

4. The current-mode analog to digital converter of claim 2, wherein a first stage of the analog-to-digital converter comprises circuitry that receives an input signal, produces a digital representation of a sampled voltage of the input signal, reconstructs an analog voltage based on the digital representation of the sampled voltage, subtracts the reconstructed analog voltage from the sampled voltage of the input signal to produce a residue voltage, and outputs the residue voltage to a voltage-mode second stage of the analog-to-digital converter.

5. The current-mode analog to digital converter of claim 1, wherein at least two of the output nodes of the current-mode sample and hold circuit are scaled to output different current values in response to the same sampled analog value of the electrical current at the current input node.

6. The current-mode analog to digital converter of claim 1, wherein at least two of the output nodes of the current-mode sample and hold circuit are scaled to output the same current value in response to the same sampled analog value of the electrical current at the current input node.

7. The current-mode analog to digital converter of claim 1, wherein:
    a first said output node of the current-mode sample and hold circuit is communicatively coupled to the current comparator; and
    a second said output node of the current-mode sample and hold circuit is communicatively coupled to residue circuitry that reconstructs an analog electrical current based on the digital representation from the at least one current comparator, subtracts the reconstructed analog electrical current from the electrical current at the second output node of the current-mode sample and hold circuit, and outputs an electrical current resulting from said subtraction to a next current-mode sample and hold circuit corresponding to a next stage of the current-mode analog to digital converter.

8. The current-mode analog to digital converter of claim 1, wherein said analog to digital converter comprises at least one output node configured to convey the digital representation of the sampled analog value of the electrical current at the current input node.

9. The current-mode analog to digital converter of claim 1, wherein said analog to digital converter further comprises a node configured to conduct current received from at said current input node to an intended destination.

10. The current-mode analog to digital converter of claim 1, further comprising a current divider circuit configured to route an amount of electrical current to said current input node of said analog to digital converter that is proportional to a total current provided by an external electrical component.

11. The current-mode analog to digital converter of claim 10, wherein said external electrical component comprises a transformer coil configured to provide an induced electrical current to the analog to digital converter.

12. The current-mode analog to digital converter of claim 10, wherein said electrical component is selected from the group consisting of: temperature sensors, antennas, optical sensors, other sensors, electrical coils, batteries, resistors, inductors, current dividers, and combinations thereof.

13. The current-mode analog to digital converter of claim 1, wherein the sampled analog value of the electrical current at the current input node represents a parameter of interest selected from the group consisting of temperature measurements, optical measurements, current measurements, battery power, antenna readings, and combinations thereof.

14. An analog-to-digital converter, comprising:
    a voltage-mode stage comprising circuitry that receives an input signal at a voltage input node, produces a digital representation of a sampled voltage of the input signal, produces a reconstruction voltage based on the digital construction of the sampled voltage, and outputs a first current representative of a difference between the reconstruction voltage and the sampled voltage of the input signal; and a current-mode stage comprising a current input node that receives the first electrical current output from the voltage-mode stage, a current-mode sample and hold circuit that outputs a second electrical current having an analog value proportional to a sampled analog value of an electrical current at the current input node, and at least one current comparator that compares the second electrical current output by the current-mode sample and hold circuit to at least one reference current to produce a digital representation of the sampled analog value of the electrical current at the current input node wherein the current-mode sample and hold circuit comprises a plurality of output nodes, each of said output nodes outputting a separate electrical current having an analog value proportional to the sampled analog value of the electrical current at the current input node.

15. The current-mode analog to digital converter of claim 14, wherein the current-mode sample and hold circuit of the current-mode stage comprises a plurality of output nodes, each said output node of the current-mode sample and hold circuit outputting a separate electrical current having an analog value proportional to the sampled analog value of the electrical current at the current input node.

16. The current-mode analog to digital converter of claim 15, wherein:
a first said output node of the current-mode sample and hold circuit in the current-mode stage is communicatively coupled to the current comparator; and
a second said output node of the current-mode sample and hold circuit in the current-mode stage is communicatively coupled to residue circuitry that reconstructs an analog electrical current based on the digital representation from the at least one current comparator, subtracts the reconstructed analog electrical current from the electrical current at the second output node of the current-mode sample and hold circuit, and outputs an output electrical current resulting from said subtraction to a next current-mode sample and hold circuit corresponding to a next stage of the current-mode analog to digital converter.

17. A system of measuring current, comprising:
an analog to digital converter, said analog to digital converter comprising:
a current input node;
a current-mode sample and hold circuit configured to output a steady source of electrical current having an analog value proportional to a sampled analog value of an electrical current at the current input node; and
at least one current comparator configured to compare the electrical current output by the current-mode sample and hold circuit to at least one reference current to produce a digital representation of the sampled analog value of the electrical current at the current input node on at least one digital output node; and
an electrical switch in electrical communication with said current input node, wherein said switch is configured to selectively couple one of a plurality of current sources to said current input node; and
an electrical switch in electrical communication with said current output node, wherein said switch is configured to selectively couple said current output node to one of a plurality of current drains.

18. The system of claim 17, wherein the analog to digital converter is a multi-stage pipelined analog to digital converter such that the current input node, the current-mode sample and hold circuit, and the at least one current comparator together comprise one stage in the analog to digital converter.

19. The system of claim 18, wherein the current-mode sample and hold circuit comprises a plurality of output nodes, each of said output odes outputting the electrical current having an analog value proportional to the sampled analog value of the electrical current at the current input node.

20. The system of claim 19, wherein:
a first said output node of the current-mode sample and hold circuit is communicatively coupled to the current comparator; and
a second said output node of the current-mode sample and hold circuit is communicatively coupled to residue circuitry that reconstructs an analog electrical current based on the digital representation from the at least one current comparator, subtracts the reconstructed analog electrical current from the electrical current at the second output node of the current-mode sample and hold circuit, and outputs an electrical current resulting from said subtraction to a next current-mode sample and hold circuit corresponding to a next stage of the analog to digital converter.

21. The system of claim 17, wherein said at least one digital output node is configured to convey the digital representation of the sampled analog value of the electrical current at the current input node to another electrical component.

22. The system of claim 17, wherein said electrical current at the current input node is representative of a parameter of interest.

23. The system of claim 22, wherein said parameter of interest is selected from the group consisting of temperature measurements, optical measurements, current measurements, battery power, antenna readings, and combinations thereof.

24. The system of claim 17, further comprising at least one current divider circuit in electrical communication with at least one of said current sources.

25. A method of obtaining a digital representation of an analog current signal with a first stage of a pipelined current mode analog to digital converter, said method comprising:
receiving with said first stage, an ion electrical current;
outputting from a current-mode sample and hold circuit an electrical current having an analog value proportional to a sampled analog value of the input electrical current wherein the current-mode sample and hold circuit comprises a plurality of output nodes, each of said output nodes outputting a separate electrical current having an analog value proportional to the sampled analog value of the electrical current at the current input node;
comparing the analog value of the electrical current output from the current-mode sample and hold circuit to at least one reference current using a current comparator; and
outputting to a digital output node a digital result of the comparison of the analog value of the electrical current output from the audit-mode sample and hold circuit to the at least one reference current.

26. The method of claim 25, further comprising providing a return path for said input electrical current.

27. The method of claim 25, further comprising:
reconstructing an analog electrical current based on the digital representation from the at least one current comparator;
subtracting the reconstructed analog electrical current from the electrical current output from the current mode sample and hold circuit; and outputting an electrical current resulting from said subtraction to a next current-mode sample and hold circuit corresponding to a next stage of analog to digital conversion.

28. The method of claim 25, further comprising:

producing a digital representation of a sampled voltage input electrical voltage;

reconstructing an analog voltage based on the digital representation of the sampled input electrical voltage;

subtracting the reconstructed analog voltage from the sampled input electrical voltage to produce a residue voltage;

converting the residue voltage to a residue current; and providing the residue current to the current mode sample and hold circuit as the input electrical current.

29. A light sensing system, comprising a photodiode in communication with an apparatus operating according to the method of claim 25.

30. An electromagnetic energy sensing system, comprising an antenna in communication with an apparatus operating according to the method of claim 25.

31. A system for sensing battery power, comprising a battery in communication with an apparatus operating according to the method of claim 25.

32. A system for inductively sensing a current in an electrical conductor, comprising a transformer disposed around said electrical conductor and in communication with an apparatus operating according to the method of claim 25.

33. A temperature sensing system, comprising a temperature sensor in communication with a system operating according to the method of claim 25.

34. A direct current motor monitoring system, comprising a direct current motor in communication with a system operating according to the method of claim 25.

35. The method of claim 25, further comprising, with a digital to analog converter, creating an analog representation of said digital result to be combined with an output from said current mode sample and hold circuit, a path between said output and said digital to analog converter having no current mirror.

* * * * *

UNITED STATES PATENT AND TRADEMARK OFFICE
CERTIFICATE OF CORRECTION

| | | |
|---|---|---|
| PATENT NO. | : 8,026,838 B2 | Page 1 of 1 |
| APPLICATION NO. | : 12/870146 | |
| DATED | : September 27, 2011 | |
| INVENTOR(S) | : Rex K. Hales et al. | |

It is certified that error appears in the above-identified patent and that said Letters Patent is hereby corrected as shown below:

Column 16, Line 6, Claim 19, change "each of said output odes" to-- "each of said output nodes"

Column 16, Line 57, Claim 25, change "output from the audit-mode sample" to-- "output from the current-mode sample"

Signed and Sealed this
Twelfth Day of June, 2012

David J. Kappos
*Director of the United States Patent and Trademark Office*